US007013449B2

(12) United States Patent
Schlansker et al.

(10) Patent No.: US 7,013,449 B2
(45) Date of Patent: Mar. 14, 2006

(54) METHOD OF DESIGNING CUSTOM CIRCUIT DEVICE USING SCHEDULING CLOCK CYCLES

(75) Inventors: Michael Schlansker, Los Altos, CA (US); Boon Seong Ang, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 309 days.

(21) Appl. No.: 10/699,241

(22) Filed: Oct. 30, 2003

(65) Prior Publication Data

US 2005/0097497 A1 May 5, 2005

(51) Int. Cl.
*G06F 17/50* (2006.01)

(52) U.S. Cl. .............................. 716/12; 716/1; 716/11; 716/14; 716/18

(58) Field of Classification Search .................... 716/1, 716/11, 12, 8; 713/100
See application file for complete search history.

(56) References Cited

U.S. PATENT DOCUMENTS

| | | |
|---|---|---|
| 4,670,749 A | 6/1987 | Freeman |
| 5,600,264 A | 2/1997 | Duong et al. |
| 5,631,578 A | 5/1997 | Clinton et al. |
| 5,651,013 A | 7/1997 | Iadanza |
| 6,204,690 B1 | 3/2001 | Young et al. |
| 6,243,851 B1 | 6/2001 | Hwang et al. |
| 6,292,022 B1 | 9/2001 | Young et al. |
| 6,353,841 B1 | 3/2002 | Marshall et al. |
| 6,553,395 B1 | 4/2003 | Marshall et al. |
| 2004/0049672 A1 * | 3/2004 | Nollet et al. ................. 713/100 |

OTHER PUBLICATIONS

V. Kathail, et al., PICO (Program In, Chip Out) : Automatically Designing Custom Computers, IEEE Computer, Sep. 2002, 35(9), pp. 39-47.
S. C. Goldstein, et al., PipeRench: A Reconfigurable Architecture and Compiler, IEEE Computer, Apr. 2000, 33(4).
S. C. Goldstein, et al., PipeRench: A Coprocessor for Streaming Multimedia Acceleration, In Proceedings of the 26th Annual International Symposium on Computer Architecture, 1999, pp. 28-39.
V. Betz and J. Rose, Effect of the Prefabricated Routing Track Distribution on FPGA Area-Efficiency, IEEE Transactions on VLSI, Sep. 1998, 6(3), pp. 445-456.
Ernre Özer, Sanjeev Banerjia, and Thomas M. Conte, Unified Assign and Schedule: A New Approach to Scheduling for Clustered Register File Microarchitectures, In Proceedings of the 31th Annual International Symposium on Microarchitecture (MICRO-31), Dallas, Texas, 1998, pp. 308-315.

(Continued)

*Primary Examiner*—Thuan Do

(57) ABSTRACT

A method of designing a custom circuit device begins with a high level architecture of subsystems coupled by virtual wires. The method comprises first through third steps. The first step comprises spatially placing the subsystems onto tiles. The second step comprises routing the virtual wires that cross boundaries of the tiles onto an interconnect architecture. The interconnect architecture comprises switches and registers. Some of the switches route a signal from a first subsystem located on a first tile to a second subsystem located on a second tile. At least two of the registers consecutively latch the signal at a time interval of no more than a repeating time period. The third step comprises scheduling of tasks according to clock cycles. According to an embodiment of the method, the repeating time period comprises a clock cycle period. According to another embodiment of the method, the repeating time period comprises a multiple of the clock cycle period.

35 Claims, 9 Drawing Sheets

OTHER PUBLICATIONS

M.C. Papaefthymiou, Understanding Retiming Through Maximum Average-Delay Cycles, Mathematical Systems Theory, 1994, 1(27), pp. 65-84.

J. Babb, R. Tessier, and A Agarwal, Virtual Wires: Overcoming Pin Limitations in FPGA-based Logic Emulators, In Proceedings of the IEEE Workshop on FPGAs for Custom Computing Machines, Los Alamitos, CA 1993, pp. 142-151.

J.S. Rose and S. Brown, Flexibility of Interconnection Structures for Field-Programmable Gate Arrays, IEEE JSSC, Mar. 1991, 26(3), pp. 277-282.

S. Note, et al., Cathedral III: Architecture driven high-level synthesis for high throughput DSP applications, In Proceedings of the 28th ACM/IEEE Design Automation Conference, DAC 91, San Francisco, CA, 1991, pp. 597-602.

Constantine N: Anagnostopoulos, Paul P. K. Lee, Application-Specific Integrated Circuits, The Electronics Handbook, pp. 731-748, CRC Press, Boca Raton FL, 1996.

Bradley K. Fawcett, Software Development Tools for Field Programmable Gate Array Devices, The Electronics Handbook, pp. 784-793, CRC Press, Boca Raton FL, 1996.

* cited by examiner

Table 3

| Time | In tile 1206 | Between tiles 1202 and 1206 | In tile 1202 | Between tiles 1202 and 1204 | In tile 1204 |
|---|---|---|---|---|---|
| 1 | | | uAddr = a + 4 | | |
| 2 | | | wAddr = b + 8 | uAddr transfers from 1202 to 1204 | |
| 3 | | wAddr transfers from 1202 to 1206 | r = a + b | | |
| 4 | w = load(wAddr) | | s = 5 + c | | u = load(uAddr) |
| 5 | | w transfers from 1206 to 1202 | x = u + r | u transfers from 1204 to 1202 | |
| 6 | | | y = w + s | | |
| 7 | | | z = s + r | | |

FIG. 13

Table 4

| Time | In tile 1206 | Between tiles 1202 and 1206 | In tile 1202 | Between tiles 1202 and 1208 | In tile 1208 |
|---|---|---|---|---|---|
| 1 | | | uAddr = a + 4 | | |
| 2 | | wAddr transfers from 1202 to 1206 | wAddr = b + 8 | uAddr transfers from 1202 to 1204 | |
| 3 | | | r = a + b | uAddr transfers from 1204 to 1208 | |
| 4 | w = load(wAddr) | | s = 5 + c | | |
| 5 | | w transfers from 1206 to 1202 | z = s + r | u transfers from 1208 to 1204 | u = load(uAddr) |
| 6 | | | y = w + s | u transfers from 1204 to 1202 | |
| 7 | | | x = u + r | | |

FIG. 14

Table 5

| Time | In tile 1210 | Between tiles 1202 and 1210 | In tile 1202 | Between tiles 1202 and 1204 | In tile 1204 |
|---|---|---|---|---|---|
| 1 | | | wAddr = b + 8 | | |
| 2 | | wAddr transfers from 1202 to 1206 | uAddr = a + 4 | | |
| 3 | | wAddr transfers from 1206 to 1210 | r = a + b | uAddr transfers from 1202 to 1204 | |
| 4 | w = load(wAddr) | | s = 5 + c | | |
| 5 | | w transfers from 1210 to 1206 | z = s + r | | u = load(uAddr) |
| 6 | | w transfers from 1206 to 1202 | x = u + r | u transfers from 1204 to 1202 | |
| 7 | | | y = w + s | | |

FIG. 15

METHOD OF DESIGNING CUSTOM CIRCUIT DEVICE USING SCHEDULING CLOCK CYCLES

RELATED APPLICATION

This application is related to U.S. application Ser. No. 10/698,271 filed on (the same day as this application), the contents of which is hereby incorporated by reference.

FIELD OF THE INVENTION

The present invention relates to the field of design of integrated circuit devices. More particularly, the present invention relates to the field of design of integrated circuit devices where a design procedure makes efficient use of interconnect resources.

BACKGROUND OF THE INVENTION

VLSI (Very Large Scale Integrated) devices include microprocessors and custom circuit devices. Custom circuit devices include ASICs (Application Specific Integrated Circuits) and programmable devices. Generally, the ASICs are designed and manufactured to perform a specific implementation. The programmable devices include non-reconfigurable devices and reconfigurable devices. The non-reconfigurable devices use fuse or antifuse technology to form permanent interconnects between various logical components and circuits. The reconfigurable devices use reconfigurable interconnects implemented with programmable switches to route signals between logical components and circuits. The reconfigurable devices include PLDs (Programmable Logic Devices), FPGAs (Field Programmable Gate Arrays), and reconfigurable DSP (Digital Signal Processing) devices.

An FPGA is illustrative of the reconfigurable devices in general. The FPGA includes logic cells coupled by interconnect wires which include reconfigurable switches. The interconnect wires and the reconfigurable switches allow data to be transferred between any two of the logic cells.

In current VLSI technology, data communication has a significant impact on a device's cost and performance. The data communication uses hardware resources, such as interconnect wires, which affects the cost of the device. Delays in the data communication affect the performance of the device. As VLSI technology continues to scale features downward and to increase device density, the impact on the cost and the performance of the device will increase. For example, greater numbers of transistors will result in greater numbers of the interconnect wires increasing the cost. Smaller transistors will result in greater packing densities of the transistors, which will require reducing cross sectional size of the interconnect wires increasing transmission delays as signals traverse the interconnect wires. Faster transistors will lead to faster clock cycle speeds, which will increase the impact of the delays associated with the data communication.

The impact of the data communication on the cost and performance is particularly significant for the reconfigurable devices such as the FPGAs. In a custom circuit device implemented with an FPGA, the time for signals to traverse the interconnect wires and the reconfigurable switches often takes up a large fraction of a clock cycle period. Furthermore, running out of interconnect resources is a common problem that often constrains the usable fraction of logic resources of a reconfigurable device. For the reconfigurable devices, it would be advantageous to be able to more efficiently use the interconnect resources.

Traditional design flow of a custom circuit device such as an ASIC or a reconfigurable device is phased, with abstractions between the phases. A common design approach is to specify a register transfer level (RTL) design in a high-level description language such as Verilog or VHDL. The RTL design is then fed through a hardware synthesis tool followed by a place and route tool. Such a design flow is common for both the ASICs and the FPGAs. The RTL design specifies the operation of hardware at a clock cycle level, i.e., what should happen at each clock cycle. Subsequent steps in the design flow have very little flexibility in altering what happens in each cycle or for inserting additional clock cycles. Any such adjustments, if at all possible, are very local and have to be done under very stringent restrictions, such as preserving the relative latency (in number of clock cycles) of different paths that diverge and subsequently merge.

By the time the traditional design flow reaches place and route, the level of abstraction has gotten very low. At this point, data transport requirements are represented at the level of unshared wires. The unshared wires are routed by the place and route tool. Decisions regarding data transfers and scheduling of operations for the device are frozen in the RTL design. In the traditional design flow, it is not possible to leverage accurate placement information when making these decisions. Further, since the scheduling of the operations in the device is fixed in the RTL design, it is not possible to accommodate changes to interconnect latency in subsequent phases of the design flow.

What is needed is a design procedure which allows more efficient use of interconnect resources.

SUMMARY OF THE INVENTION

The present invention is a method of designing a custom circuit device. According to an embodiment, the method begins with a high level architecture of subsystems coupled by virtual wires. The method comprises first through third steps. The first step comprises spatially placing the subsystems onto tiles. The second step comprises routing the virtual wires that cross boundaries of the tiles onto an interconnect architecture. The interconnect architecture comprises switches and registers. Some of the switches route a signal from a first subsystem located on a first tile to a second subsystem located on a second tile. At least two of the registers consecutively latch the signal at a time interval of no more than a repeating time period. The third step comprises scheduling of tasks according to clock cycles. According to an embodiment of the method, the repeating time period comprises a clock cycle period. According to another embodiment of the method, the repeating time period comprises a multiple of the clock cycle period.

In another embodiment of the method, the method further comprises a fourth step of mapping the subsystems and the virtual wires that do not cross the tiles onto the circuits of the tiles.

These and other aspects of the present invention are described in more detail herein.

BRIEF DESCRIPTION OF THE DRAWINGS

The present invention is described with respect to particular exemplary embodiments thereof and reference is accordingly made to the drawings in which:

FIG. 13 is a table of tasks scheduled in a design procedure according to an embodiment of the present invention;

FIG. 14 is a table of tasks scheduled in a design procedure according to an embodiment of the present invention; and FIG. 15 is a table of tasks scheduled in a design procedure according to an embodiment of the present invention.

DETAILED DESCRIPTION OF A PREFERRED EMBODIMENT

The present invention provides an approach to data transport that improves performance while lowering wire costs. Aspects of the present invention include a data transport architecture and a design procedure. Both aspects utilize pipelining of communication path segments, which preclude long communication paths from adversely impacting system cycle time. Further, the present invention allows time multiplexing along the communication path segments, which makes more efficient use of the communication path segments.

Starting with a high level architecture of virtual subsystems comprising of virtual operations and data objects coupled by virtual wires, the design procedure begins with spatial planning in which a coarse placement of the subsystems is determined. The design procedure continues with routing in which at least some of the virtual wires are placed onto the data transport architecture. Decisions regarding the pipelining and the time-multiplexing are made during the routing. In so doing, the pipelining is driven by knowledge of spatial locations of data sources and destinations. Similarly, opportunities for the time multiplexing along the communication path segments are derived from the spatial plan and communication needs.

The design procedure concludes with scheduling in which a schedule of tasks for a particular device is determined. At least two benefits follow from doing the scheduling after the spatial planning and the routing. First, the scheduling makes use of the decisions regarding the pipelining and the time multiplexing to schedule data transfers on data transport segments. Second, the scheduling makes use of transport latency information that follows from the pipelining so that a relative ordering and timing of operations can be adjusted to accommodate data transport latencies.

The present invention is applicable to digital hardware system design, including ASICs (Application Specific Integrated Circuits), FPGAs (Field Programmable Gate Arrays), PLD's (Programmable Logic Devices), and other reconfigurable devices. The FPGAs, the PLDs, and the other reconfigurable devices may incorporate configurable data transport elements different from those found in today's devices. The configurable data transport elements are better suited to the pipelining and the time multiplexing of the present invention. The design procedure of the present invention may be manifested in automated design tools, such as compilation, synthesis, or CAD tools, or may be accomplished by manual procedures or some mixture of both.

Figure 1:
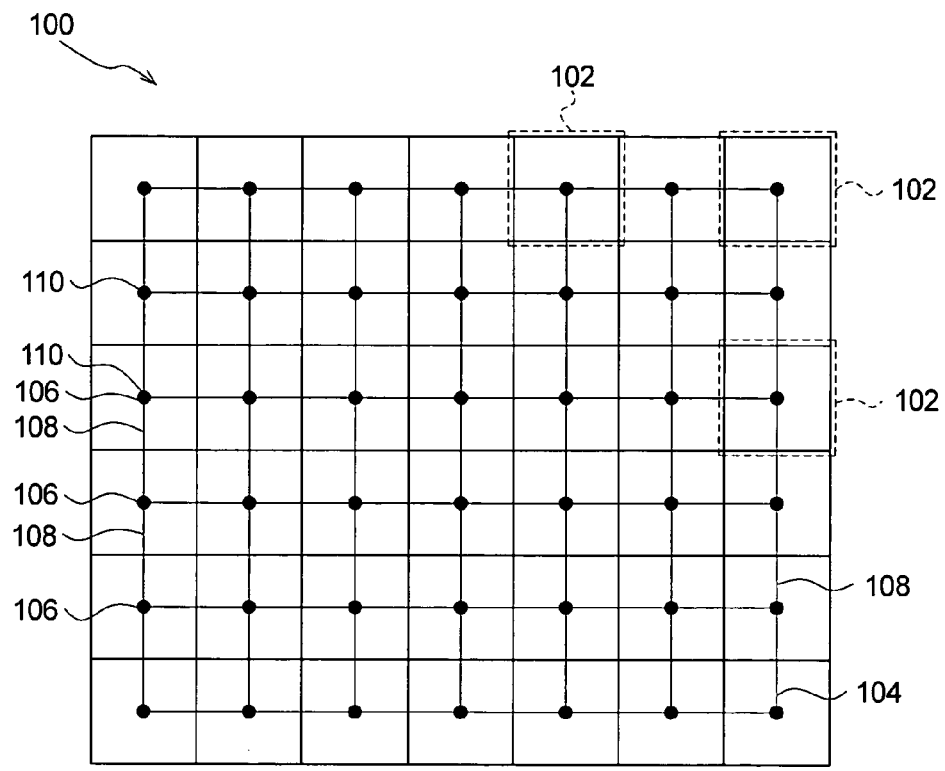
FIG. 1 schematically illustrates a reconfigurable device according to an embodiment of the present invention.

An embodiment of a reconfigurable device of the present invention is schematically illustrated in FIG. 1. The reconfigurable device 100 comprises tiles 102 and an interconnect architecture 104. Each of the tiles 102 comprises a circuit. The interconnect architecture 104 couples to the circuit of each tile 102, illustrated as data interchange points 106. As used herein, the term "interconnect architecture" refers to structure that interconnects the tiles.

The reconfigurable device 100 may contain various computation, memory, interconnect, and control elements, which are configurable to varying degrees and which are useful for implementing hardware designs. Some specific examples of possible components for the reconfigurable device 100 include look-up tables (LUTs) that can be programmed to implement any combinational logic function, special arithmetic support such as carry-chains, specialized (hardwired) functional units for performing mathematical or logical operations such as multipliers, reconfigurable interconnect such as wire segments connected via programmable switches, and memory blocks. Such components are common in FPGAs and in more computation-oriented reconfigurable architectures aimed at the DSP (Digital Signal Processing) market. It is expected that depending on the application domain of the reconfigurable device 100, other special components may be included, for example, content addressable memories (CAMS).

Typically, each tile 102 of the reconfigurable device 100 contains a mix of various components and is thus heterogeneous. Alternatively, some or all of the tiles 102 contain identical components making these tiles 102 homogeneous. Typically, the tiles 102 are replicated in a two dimensional grid of the tiles 102. The tiles 102 are sized so that a typical data transport within each tile 102 is expected to stay within a clock cycle period while the typical data transport that goes beyond the tile 102 is expected to exceed the clock cycle period. For the design procedure, which is discussed above and in more detail below, the tiles 102 provide a convenient unit for the coarse placement and for inferring pipelining requirements.

In an alternate embodiment of the reconfigurable device 100, the tiles 102 are sized so that the typical data transport within each tile 102 is expected to stay within a repeating time period while the typical data transport that goes beyond the tile 102 is expected to exceed the repeating time period. In the alternate embodiment, the repeating time period comprises one or more of the clock cycle periods.

It will be readily apparent to one skilled in the art that the tiles 102 need not be rectangular as illustrated in FIG. 1 and can instead be of another shape such as triangular or hexagonal. Further, it will be readily apparent to one skilled in the art that the tiles 102 need not be of a uniform shape or size.

Typically, the interconnect architecture 104 is made up of a two dimensional network of data transport channels 108. Each of the data transport channels 108 contains multiple data transport segments. Typically, the data transport channels 108 couple to the data interchange points 106, where data can enter or leave the interconnect architecture 104.

The interconnect architecture 104 comprises switches and registers. The switches route signals between two of the tiles 102. The registers preferably latch the signals at time intervals that are within a clock cycle period. Alternatively, the registers latch the signals at time intervals that are within a repeating time period. Since the pipelining takes place by clock cycles, a pair of the registers that latch a signal consecutively form a pipeline segment.

In an alternate embodiment of the interconnect architecture 104, the registers latch the signals at time intervals that are within a repeating time period where the repeating time period comprises one or more clock cycle periods. In the alternate embodiment, the registers latch signals at an end of the repeating time period. For example, if the repeating time period is two of the clock cycle periods, the registers would latch the signals every other of the clock cycle periods.

In an embodiment of the interconnect architecture 104, data interchanges 110 are located at the data interchange points 106. In this embodiment, the data interchanges 110 comprise one of the switches and a set of the registers.

Typically, the data interchanges 110 permit data coming in from one of the data transport channels 108 to leave the data interchange 110 along any of the data transport channels 108 coupled to the data interchange 110. The data can also be stored into temporary registers and thus delayed for multiple clock cycles at each data interchange. The tiles 102 conveniently serve as a reference framework for positioning the data interchanges 110.

Figure 2:
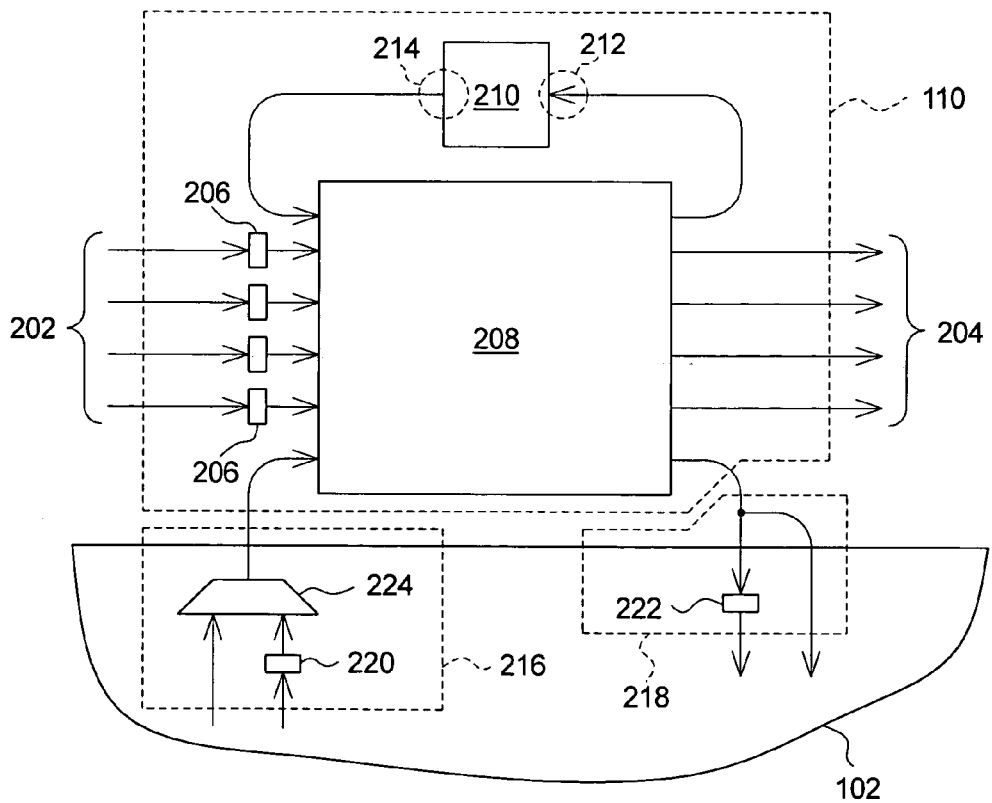
FIG. 2 schematically illustrates a data interchange and a portion of a tile of a reconfigurable device according to an embodiment of the present invention.

It will be readily apparent to one skilled in the art that the data interchange points 106 represent coupling locations between the tiles 102 and the interconnect architecture 104 and that the data interchange points 106 need not be located in centers of the tiles 102 as depicted schematically in FIG. 1. Further, it will be readily apparent to one skilled in the art that the data interchanges 110 need not be located at the data interchange points 106 but rather can be coupled to the data interchange points 106 by one or more conductive paths. An embodiment of the data interchange 110 and a portion of one of the tiles 102 is illustrated schematically in FIG. 2. Incoming data transport segments 202 enter the data interchange 110 and outgoing data transport segments 204 leave the data interchange 110. The data transport segments are comprised of a bit-width suitable for the design, for example, 4-bit or 8-bit nibbles. Typically, the registers 206 couple the incoming data transport segments 202 to the switch 208. Preferably, a register file 210 is coupled to the switch 208, which allows data to be buffered at the data interchange 110 for one or more clock cycles. Alternatively, the data interchange 110 does not include the register file 210.

Preferably, the switch 208 comprises a crossbar switch, which allows data from any of the four in-coming data transport segments 202, the tile 102, or the register file 210 to be sent to any one (or multiple) of the out-going data transport segments 204, or sent into the tile 102. Alternatively, the switch 208 comprises another switch having more limited switching capability than the crossbar switch.

The register file 210 in the data interchange 110 includes write and read ports, 212 and 214. The register file 210 provides a buffering capability, which allows data to be delayed by one or more clock cycles by storing the data in the register file 210. As a minimum there must be at least one of the write ports 212 and one of the read ports 214. The register file 210 provides greatest scheduling flexibility when there are enough of the write ports 212 to store data arriving from any of the incoming data transport segments 202 and when there are enough of the read ports 214 to transmit data in all of the outgoing data transport segments 204. If there are fewer of the write ports 212 than of the incoming data transport segments 202, only a limited amount of incoming data can be buffered into the register file 210 each clock cycle. Similarly, if there are fewer of the read ports 214 than of the outgoing data transport segments 204, only a limited amount of buffered data can be output along the outgoing data transport segments 204 each clock cycle.

The tile 102 includes output and input ports, 216 and 218, coupling the tile 102 to the data interchange 110. At a minimum, there is at least one of the output ports 216 per tile 102 and one of the input ports 218 per tile 102. Preferably, the tile 102 includes a plurality of the output ports 216 and a plurality of the input ports 218. Data leaving the tile 102 may optionally be latched into a first register 220 before entering the switch 208. A multiplexer 224 may select between latched and unlatched data coupling to the switch 208. Similarly, data arriving into the tile 102 may optionally be latched at a second register 222.

In an alternative embodiment, the data interchange 110 includes a register coupling the output port 216 of the tile 102 to the switch 208 of the data interchange 110.

An embodiment of the data interchange 110 may include support for additional data transport segments in each of data transport channels 108. The data interchange 110 may include additional inputs and outputs for the switch 208 in order to accommodate the additional data transport segments.

Alternatively, an embodiment of the reconfigurable device 100 may employ a plurality of the data interchanges 110 at each of the data interchange points 106, each connecting a subset of the data transport segments. This embodiment is more scalable since it requires smaller switches; but it partitions the segments at each data interchange point 106 into sets. In this embodiment, there is much flexibility in how the data transport segments are wired between the data interchange points 106. For example, a design may partition the data transport segments across the device, essentially overlaying multiple independent data transport networks on the device. Alternatively, the wiring of data transport segments between the data interchange points 106 can enable crossing from one partition set to another to prevent device-wide segregation of data transport segments into non-overlapping partitions.

In an embodiment of the present invention, a programmatic mode of control is used, together with static scheduling, to control data transfers through an interconnect architecture of the present invention. Static scheduling is employed to avoid conflicting access to common resources. This is in contrast to dynamic arbitration that performs allocation decisions at run time, based on requests initiated at run time by parties interested in using a common shared resource.

Under the programmatic control, a locally sequenced program controls each data interchange. The locally sequenced program can be a program execution mechanism using instructions drawn from memory or a state-machine, either of which provides a local thread of control. According to an embodiment, the state machine comprises reconfigurable logic. The local thread of control provides control continuity in the absence of external commands. When making control decisions, the programmatic control need not consider the content flowing through the data transport segments.

In one embodiment, the locally sequenced control program specifies on a clock cycle by clock cycle basis how a data interchange operates. The program specifies how a switch of the data interchange is configured, i.e. which input is coupled to which output or outputs. It also specifies whether any data should be stored into a register file of the data interchange, and names the destination register or registers. The program also names the registers, if any, to read out of the register file. The program may also control whether each of the registers latches in a new value in that clock cycle, or whether it holds the previously latched value.

To facilitate flexible local control over execution path, the locally sequenced control program is equipped with the ability to perform local conditional branches. One embodiment equips the control program with conditional branch instructions, general arithmetic and logical operations to compute condition variables, and scratch registers. This will, for example, enable it to locally manage loop counters, counting the number of iterations to locally determine when the loop should end.

A typical data transfer path involves multiple data interchanges. For a transfer to occur successfully over such a path, the programmatic controls in the data interchanges along the path work synchronously to ensure that the correct operations happen in each cycle. The control of a data interchange upstream has to put out the correct value, while the data interchange downstream has to route it, or store it into a register as appropriate. This synchronous collaboration is statically choreographed, and encoded into the control programs running in the data interchanges.

To enable the locally sequenced program to collaborate with other aspects of a device, the programmatic control allows externally initiated branching of its local thread of control. A remote-branch mechanism is described in U.S. patent application Ser. No. 10/405,170 filed on Apr. 1, 2003, which is hereby incorporated by reference. The remote-branch mechanism is one way to achieve the externally initiated branching of the local thread of control. Essentially, the programmatic control at a data interchange receives branch commands sent to it from other control entities on a device. Upon receiving a remote branch command, the programmatic control transfers its local thread of control to the branch target specified by the branch command, and continues from there.

According to an embodiment, the branch command multicasts the branch instruction to all the data interchanges collaborating on a computation, causing them to branch to code sequences that have been statically planned to work in harmony. Thus, all the data interchanges on a data transfer path may be among destinations of the branch instruction.

An embodiment may support one programmatic control thread at each data interchange. Another embodiment may support multiple programmatic control threads while still using static conflict resolution. This has the benefit of enabling computations that have different control flow (i.e., they have different branching conditions) to share a data interchange. Static resource partitioning among otherwise independent threads can be achieved by either space or time partitioning, or both. Time partitioning divides time into recurring sequence of time slots, with each time slot assigned to a thread. For example, a first thread uses a data interchange resource on odd cycles while a second thread uses the data interchange on even cycles. Alternatively, space partitioning allocates different resources within the data interchange to each thread. For example, a switch of a data interchange may be space partitioned so that first and second inputs and first and second outputs are used by a first thread while third and fourth inputs and third and fourth outputs are used by a second thread. Each thread of control indicates the resources over which it is asserting control for each cycle, so that merging overall control from multiple threads is straight forward. Because resource allocation is done statically, dynamic arbitration and allocation is not needed.

Unlike the programmatic control mechanism, tag-based switching decides how a unit of data, typically referred to as a packet, is treated as it flows through one of the data interchanges based on a tag, sometimes called a header, carried in the packet.

In one embodiment of the tag-based switching mechanism, the control portion of each data interchange holds a programmable lookup table. The tag carried on each packet is used as the key for a lookup in this table. Successful lookup yields information such as which output port, or ports of the data interchange that packet should be forwarded to.

In a simple implementation of the tag-based switching, a packet propagating through data interchanges encounters a constant delay in each of the data interchanges. In the constant delay, a first chunk of data of the packet is delayed a constant number of clock cycles before emerging from each of the data interchanges that it encounters. In contrast, the programmatic control can buffer data into the register file within a data interchange and delay it for an arbitrary number of clock cycles.

In another implementation, the tag-based switching is augmented with a programmable delay. The programmable delay allows a packet to have different delays associated with the packet at each of the data interchanges that it encounters. An embodiment of the programmable delay under the tag-based switching augments the programmable lookup table to include two other values as part of the result of a successful lookup. One value is the number of cycles of additional delay to add to the constant transit delay through the data interchange. A second value, a base buffer register name, is the name of a first register in a register file of a data interchange used for buffering the data.

When a packet carries data spanning m clock cycles, and n cycles of delays are needed, min(n,m) registers are needed for buffering the data undergoing the delay. According to an embodiment, m is greater than n so that min(n,m) is n. One embodiment implements this by statically allocating n registers with consecutive names for this buffering purpose. The data interchange keeps a modulo counter for each input port, that starts with zero and increments each cycle, modulo the desired additional cycles of delay n. In each clock cycle, the pre-increment count is added to the base buffer register name to compute an actual register used to buffer data arriving that cycle.

An embodiment of a data interchange that supports multiple write ports may include a third value in the results read out of the lookup table in a successful lookup. This value specifies the write port used to buffer data into a register file of the data interchange. Similarly, an embodiment that supports multiple read ports may include a fourth value in the lookup results, specifying the read port to use when it is time to read out the buffered data for transmission out of the data interchange.

The data interchange includes mechanisms for reading out the data after the desired delay and sending it out the desired output port. In one embodiment, each read port of a register file has a pending action queue that keeps track of read actions to be performed in some future time. As data is buffered into the register file at register r for an n cycle delay, a pending action to read out the data n cycles later from register r is queued with the read port specified by the results of the table lookup. In each clock cycle, the pending action queue is advanced, and a pending action that has become current is performed. A similar queue is maintained for pending actions at a switch of the data interchange. A slight difference is multiple actions using different resources may be performed at the switch each clock cycle, so the entry for each cycle in the switch's pending action queue needs to accommodate multiple actions.

A pending action queue can be implemented with a parallel-to-serial shift queue. When an action requires a number of cycles of delay, it is inserted into the shift queue at a position that corresponds to the number of cycles of delay from a head of the queue. The queue is then shifted each clock cycle. When it gets to the head of the queue, the action is performed.

The embodiments of the tag-based switching discussed above utilize a lookup table. An alternate embodiment carries information within a tag. As the packet passes through each data interchange, it strips off information at the head of the tag, leaving the rest for subsequent data interchanges. An advantage of this embodiment is that a lookup table is not needed. It also avoids the overhead of setting up the lookup tables. In contrast, an advantage of the tag-based switching that uses the lookup tables is that the tags are smaller.

The programmatic control mechanism is efficient when the control follows a locally determined path for a significant amount of time after it is triggered by an external source. An example is the execution of a counted loop body. In comparison, the tag-based switching is appropriate for less repeated, externally determined transfers. Examples include data transfers in non-loop sections of execution.

In an embodiment of the reconfigurable device of the present invention, the interconnect architecture and a branch control network are merged in order to share hardware resources. In another embodiment, the branch control network comprises a separate circuit. In a further embodiment, the reconfigurable device relies on the tag based switching, eliminating a need for the branch control network.

The pipelining and the time multiplexing of the present invention are more fully described in examples provided below.

An example of the pipelining of the present invention is described below relative to FIGS. 3 and 4. An embodiment of a reconfigurable device of the present invention is illustrated schematically in FIG. 3. The reconfigurable device 300 comprises tiles 102', an interconnect architecture 104', and data interchanges 110'. A first tile 302 contains a first array A having first values Va. A second tile 304 contains a second array B having second values Vb. A third tile 306 contains a Multiply and Accumulate Circuit (MAC). The interconnect architecture 104' includes first, second, and third data interchanges, 312, 314, and 316, coupled to the first, second, and third tiles, 302, 304, and 306, respectively. The interconnect architecture 104 further includes fourth and fifth data interchanges, 318 and 320.

Figure 4:
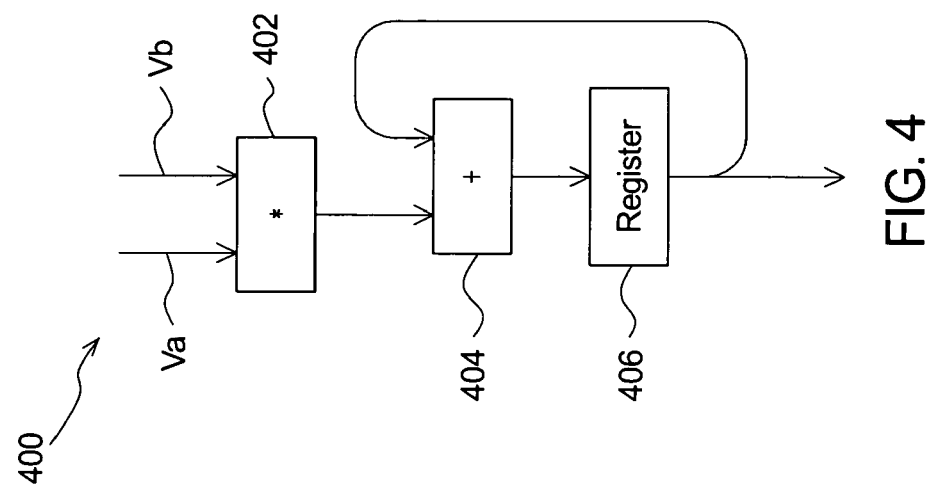
FIG. 4 schematically illustrates a multiply and accumulate circuit within a tile of a reconfigurable device according to an embodiment of the present invention.

The MAC is illustrated schematically in FIG. 4. The MAC 400 includes a multiplier 402, an adder 404, and a register 406. In operation, the multiplier 402 multiplies the first and the second values, Va and Vb, forming a product. The adder 404 adds the product to a register value located in the register 406 to form a sum. The sum then replaces the register value in the register 406. At the beginning of a series of MAC computation, register 406 is initialized to zero, before additional values are accumulated in it.

Figure 3:
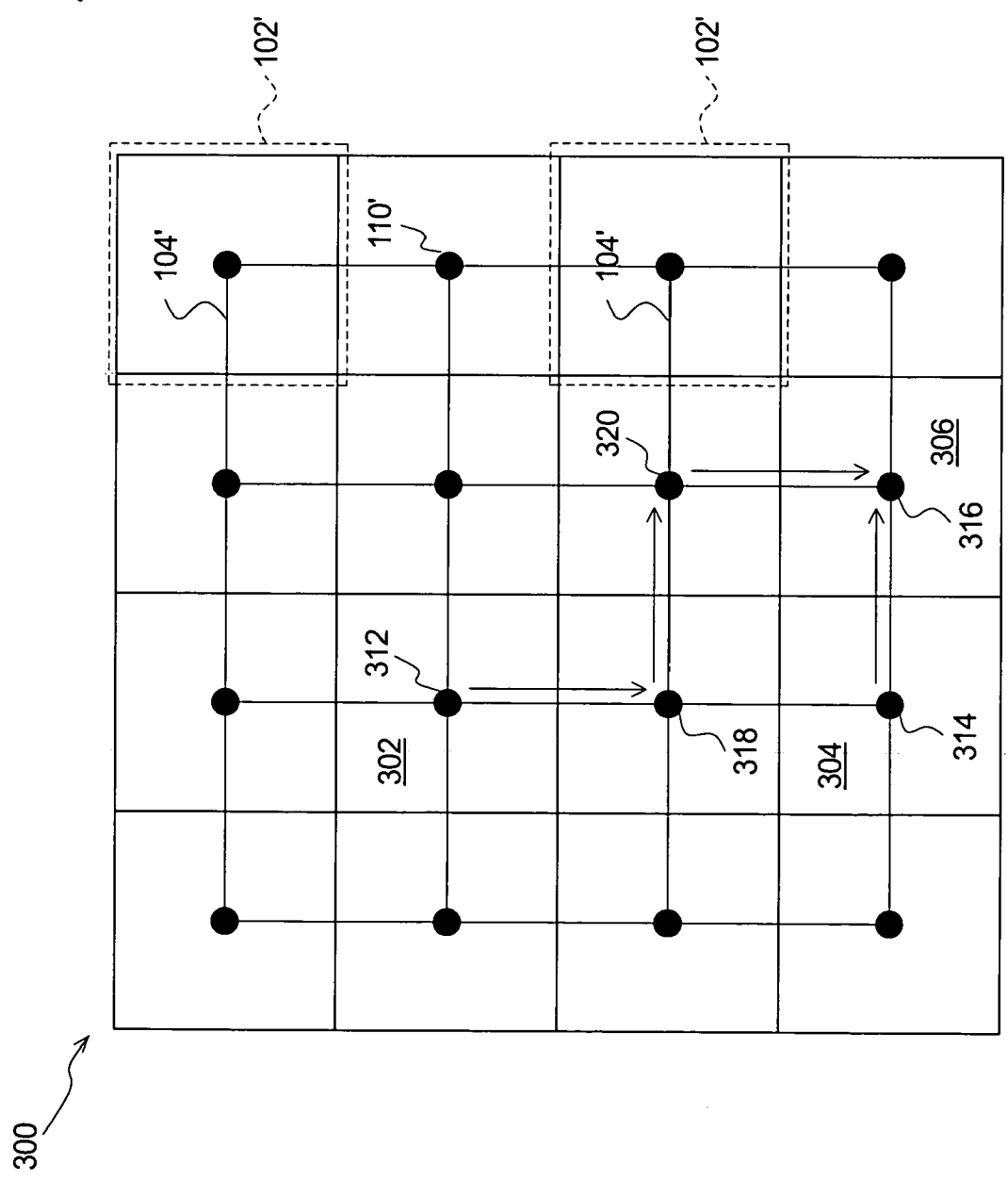
FIG. 3 schematically illustrates a reconfigurable device according to an embodiment of the present invention.

In operation, with reference to FIG. 3, the first value Va is latched into a register of an output port of the tile 302 coupled to the first data interchange 312 in a first clock cycle. In a second clock cycle, the first value Va is transferred to the fourth data interchange 318 while the second value Vb is latched into a register of an output port of the tile 304 coupled to the second data interchange 314. In a third clock cycle, the first value Va is transferred from the fourth data interchange 318 to the fifth data interchange 320 while the second value Vb is transferred from the second data interchange 312 to the third data interchange 314. In a fourth clock cycle, the first value Va is transferred from the fifth data interchange 320 to the third data interchange 316 while the second value Vb is transferred from the third data interchange 316 into the third tile 306. In a fifth clock cycle, the first value Va is transferred from the third data interchange 316 into the third tile 306. Table 1 summarizes the first through fifth clock cycles relative to the first and second values, Va and Vb. (Note that in tables, "data interchange" has been abbreviated as DI.)

TABLE 1

| Time | First Value Va | Second Value Vb |
| --- | --- | --- |
| 1 | Latch Va into register coupled to first DI 312 | |
| 2 | Transfer Va from first DI 312 to fourth DI 318 | Latch Vb into register coupled to second DI 314 |
| 3 | Transfer Va from fourth DI 318 to fifth DI 320 | Transfer Vb from second DI 314 to third DI 316 |
| 4 | Transfer Va from fifth DI 320 to third DI 316 | Transfer Vb from third DI 316 into third tile 306 |
| 5 | Transfer Va from third DI 316 into third tile 306 | |

Depending upon availability of resources, it may be possible to begin new sequences of the first through fifth clock cycles each clock cycle, which is referred to as an initiation interval of one. In such a scenario, the pipelining allows the MAC 400 to begin work on a new set of inputs in each clock cycle.

But if there is a limit on the availability of resources, it may only be possible to begin new sequences of the first through fifth clock cycles every other clock cycle, which is referred to as an initiation interval of two. Or it may only be possible to begin new sequences of the first through fifth clock cycles every third clock cycle, which is referred to as an initiation interval of three. For example, the third tile 306 may only have one port available for receiving the first and second values, Va and Vb. In such a scenario, the pipelining allows the MAC 400 to perform an operation every other clock cycle.

If the programmatic mode of control is used to control the transfer of the first and second values, Va and Vb, each of the first through fifth data interchanges, 312 . . . 320, is sent a remote branch at the start of the transfer. With synchronous, predictable timing across the system, the first through fifth data interchanges, 312 . . . 320, cooperate to implement the desired schedule. In an embodiment of the present invention, each of the remote branches keeps a local count to know when to terminate the transfer.

An example of the pipelining and the time multiplexing of the present invention is described below with reference to FIGS. 5 and 6. The reconfigurable device 300 is illustrated schematically in FIG. 5. The reconfigurable device 300 continues to operate the MAC 400 (FIG. 4) in the third tile 306 with the first and second values, Va and Vb, provided from the first and second arrays located in the first and second tiles, 302 and 304, respectively. In addition, the first tile 302 contains a third array having third values Vc and a sixth tile 308 contains a fourth array having fourth values Vd. A seventh tile 310 contains a divide and store circuit. The interconnect architecture includes sixth and seventh data interchanges, 322 and 324, which couple to the sixth and seventh tiles, 308 and 310, respectively.

Figure 6:
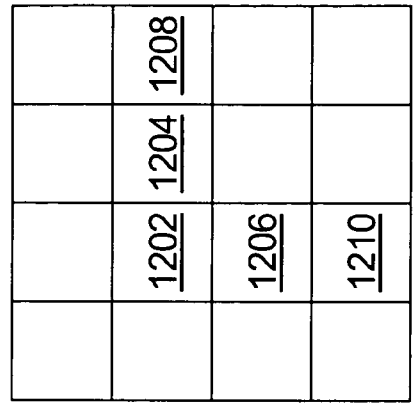
FIG. 6 schematically illustrates a divide and store circuit within a tile of a reconfigurable device according to an embodiment of the present invention.

The divide and store circuit is illustrated schematically in FIG. 6. The divide and store circuit 600 comprises a divider 602 and a register file 604. The divider 602 divides the third value Vc with the fourth value Vd resulting in a fifth value, which is stored in a fifth array located in the register file 604.

Figure 5:
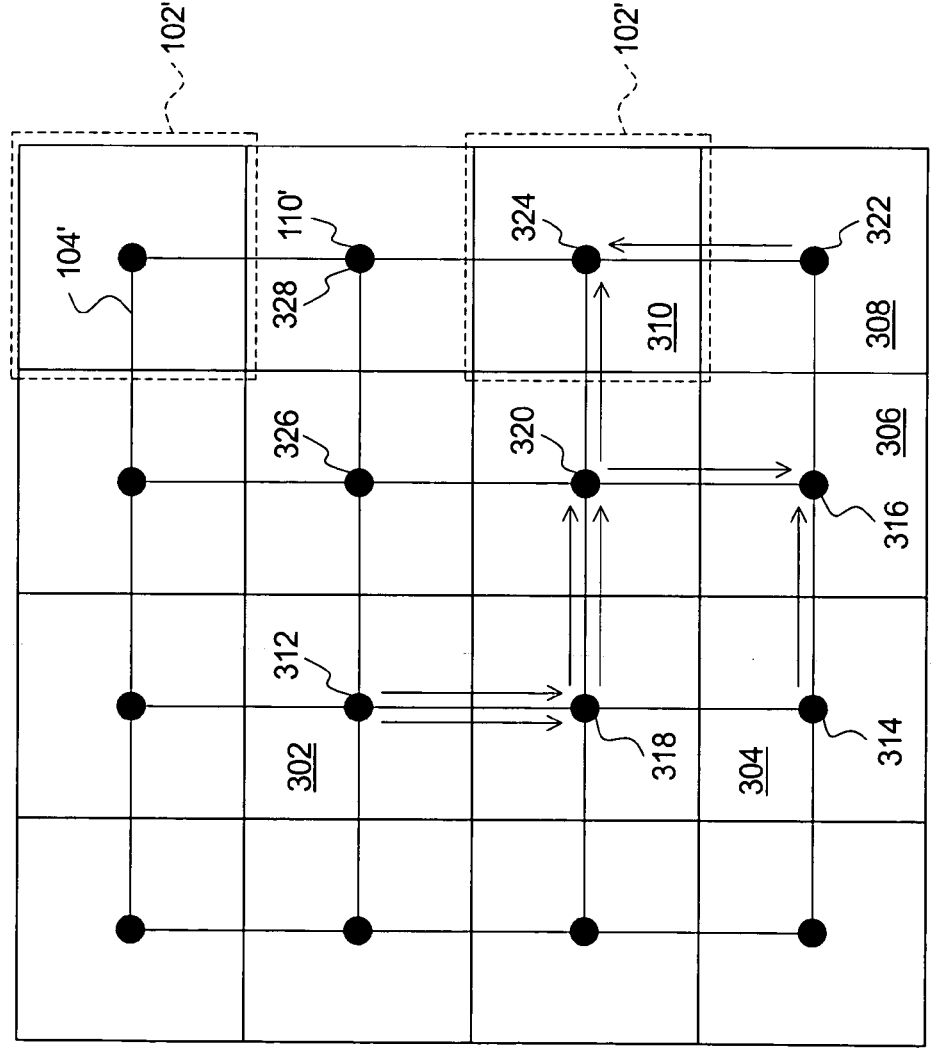
FIG. 5 schematically illustrates a reconfigurable device according to an embodiment of the present invention.

In operation, with reference to FIG. 5, the third value Vc is latched into the register of a tile output port coupled to the first data interchange 312 in a zeroeth clock cycle. In the first clock cycle, the third value Vc is transferred from the first data interchange 312 to the fourth data interchange 318 while the fourth value Vd is latched into a register of a tile output port coupled to the sixth data interchange 322. In the second clock cycle, the third value Vc is transferred from the fourth data interchange 318 to the fifth data interchange 320 while the fourth value Vd is transferred from the sixth data interchange 322 to the seventh data interchange 324. In the third clock cycle, the third value Vc is transferred from the fifth data interchange 320 to the seventh data interchange 324 while the fourth value Vd is transferred from the seventh data interchange 324 into the seventh tile 310. In the fourth clock cycle, the third value Vc is transferred from the seventh data interchange 324 into the seventh tile 310. Table 2 summarizes the zeroeth through fifth clock cycles relative to the first through fourth values, Va . . . Vd.

If the MAC 400 (FIG. 4) and the divide and store circuit 600 (FIG. 6) operate with the initiation interval of two, the time multiplexing of the present invention allows efficient use of the data transfer segments between the first and fourth data interchanges, 312 and 318, and between the fourth and fifth data interchanges, 318 and 320. In such a scenario, the time multiplexing of a first segment transfers the first value Va from the first data interchange 312 to the fourth data interchange every other clock cycle. In alternate clock cycles, the time multiplexing of the first segment transfers the third value Vc between these data interchanges. The time multiplexing of a second segment makes similar transfers of the first and third values, Va and Vc, between the fourth and fifth data interchanges, 318 and 320. But these transfers take place with reversed clock cycles from the transfers between the first and fourth data interchanges, 312 and 314.

If the MAC 400 or the divide and store circuit 600 operate with the initiation interval of one, the time multiplexing might not be efficient for the transfers of the first and third values, Va and Vc. In such a scenario, the transfer of the third value Vc may be more efficient using a different route from the transfer of the first value Va. For example, the third value Vc could be routed through eighth and ninth data interchanges, 326 and 328. This would require that two output ports be available in the first tile 302 for simultaneous transfer of the first and third values, Va and Vc, into registers of the first data interchange 312.

Figure 7:
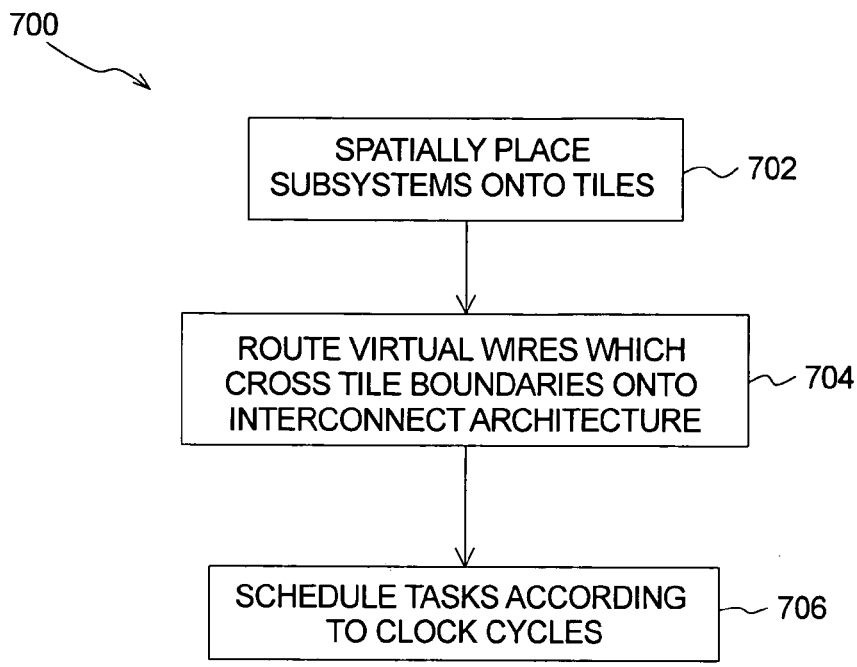
FIG. 7 illustrates a flow chart of a design procedure according to an embodiment of the present invention.

The design procedure of the present invention is illustrated as a flow chart in FIG. 7. The design procedure 700 comprises the steps of the spatial planning 702, the routing 704, and the scheduling 706.

Generally, a design flow starts with a program specification of a required computation. For example, the program specification could be a C program. The CAD (Computer Aided Design) industry sometimes refers to the program specification as a behavioral specification. The program specification differs from an RTL (Register Transfer Level) specification in that it does not specify action on a clock cycle by clock cycle basis but instead does it more abstractly. When the program specification is transformed into internal representation and analyzed by a compiler/synthesis tool, the program specification can be viewed as

TABLE 2

| Time | 1st Value Va | 2nd Value Vb | 3rd Value Vc | 4th Value Vd |
|---|---|---|---|---|
| 0 | | | Latch Vc into register coupled to first DI 312 | |
| 1 | Latch Va into register coupled to first DI 312 | | Transfer Vc from first DI 312 to fourth DI 318 | Latch Vd into register coupled to sixth DI 322 |
| 2 | Transfer Va from first DI 312 to fourth DI 318 | Latch Vb into register coupled to second DI 314 | Transfer Vc from fourth DI 318 to fifth DI 320 | Transfer Vd from sixth DI 322 to seventh DI 324 |
| 3 | Transfer Va from fourth DI 318 to fifth DI 320 | Transfer Vb from second DI 314 to third DI 316 | Transfer Vc from fifth DI 320 to seventh DI 324 | Transfer Vd from seventh DI 324 into seventh tile 310 |
| 4 | Transfer Va from fifth DI 320 to third DI 316 | Transfer Vb from third DI 316 into third tile 306 | Transfer Vc from seventh DI 324 into seventh tile 310 | |
| 5 | Transfer Va from third DI 316 into third tile 306 | | | | prescribing a logical, partial ordering of actions encompassing memory loads/stores, arithmetic operations, etc.

A compiler/synthesis tool will typically perform various optimizations and code restructuring to remove redundant computation and to expose parallelism. These steps precede the design procedure of the present invention. Once the optimizations and the code restructuring are complete, the program specification can be viewed as having been transformed into a virtual architecture. The virtual architecture comprises the virtual subsystems coupled by the virtual wires, which provides a starting point for the design procedure of the present invention.

The virtual architecture deals with virtual entities such as operations and memory objects. This is in contrast to hardware entities of functional units and RAM (Random Access Memory) blocks, where the functional units execute the operations and where the RAM blocks hold the memory objects. At some point, a mapping from the virtual entities to the hardware entities is needed. The mapping may be done before, during, or after the design procedure 700.

Figure 10:
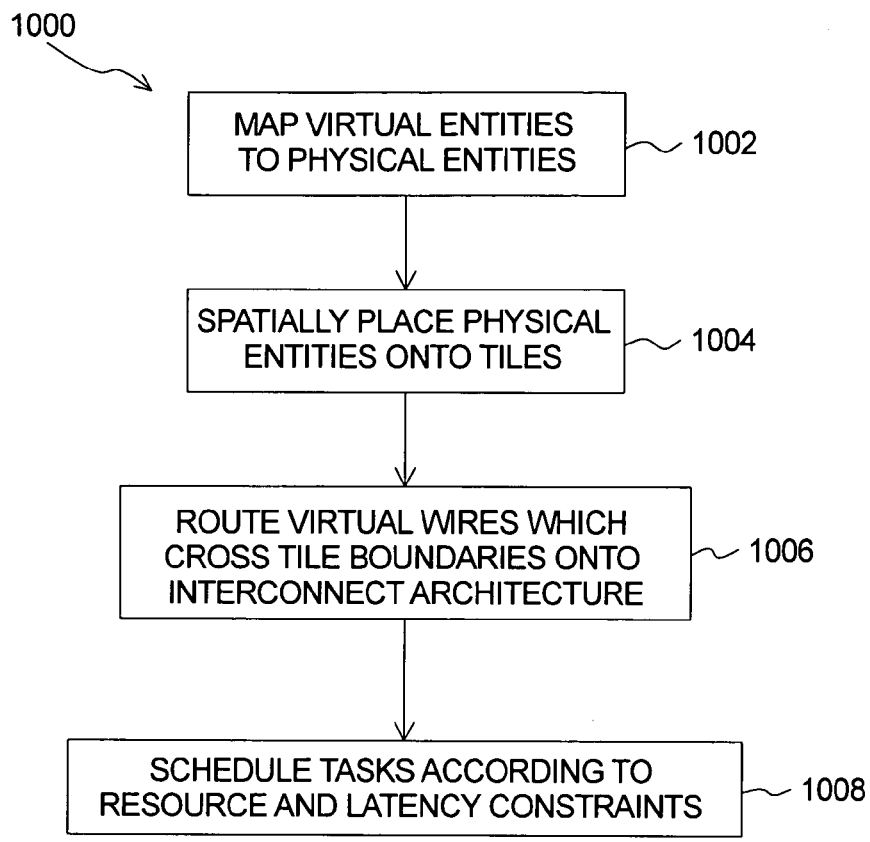
FIG. 10 illustrates a flow chart of a design procedure according to an embodiment of the present invention.

An embodiment of the design procedure of the present invention is illustrated as a flow chart in FIG. 10. The design procedure 1000 begins with a first step 1002 of mapping of virtual entities to physical entities. The design procedure 1000 continues with a second step 1004 of spatially placing the physical entities onto tiles. A third step 1006 comprises routing virtual wires that cross tile boundaries onto an interconnect architecture. The method concludes with a fourth step 1008 of scheduling tasks according to resource and latency constraints. In the design procedure 1000, the subsystems placed in the second step 1004 comprise hardware entities of functional units and RAM blocks. The second step 1004 performs coarse placement of the functional units and the RAM blocks to tiles under the constraint that tile resources are not over committed. Dealing with the hardware entities enables a more definite estimate of the tile resources needed. Nevertheless, in tracking usage of the tile resources, additional buffering resources should be set aside for temporary buffering needs that may arise during the fourth step 1008.

Figure 11:
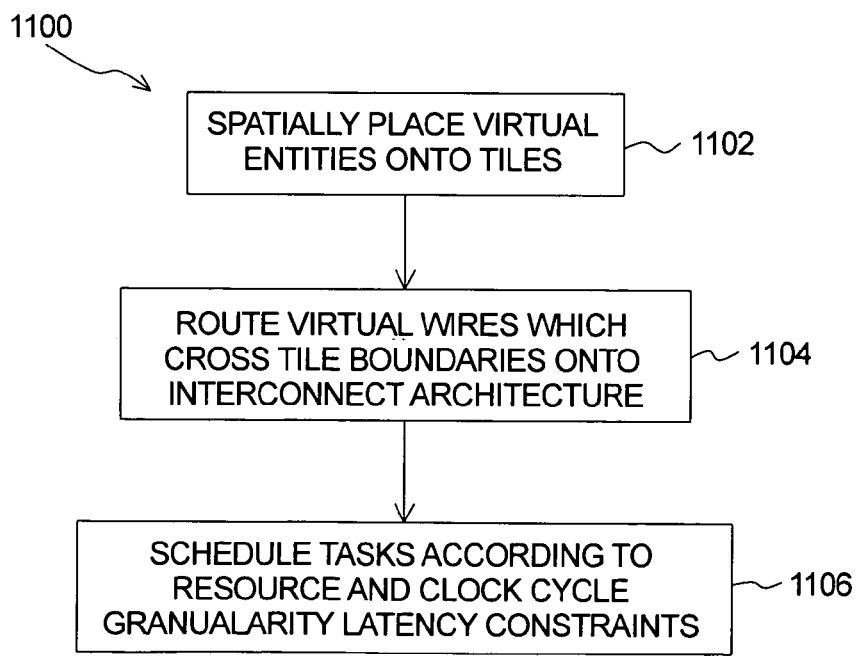
FIG. 11 illustrates a flow chart of a design procedure according to an embodiment of the present invention.

Another embodiment of the design procedure of the present invention is illustrated as a flow chart in FIG. 11. The design procedure 1100 begins with a first step 1102 of spatially placing virtual entities onto the tiles. A second step 1104 comprises routing virtual wires that cross tile boundaries onto an interconnect architecture. The method concludes with a third step 1106 of scheduling tasks according to resource and clock cycle granularity latency constraints and concurrently mapping virtual entities to physical entities.

In the design procedure 1100, the subsystems comprise virtual entities, which comprise operations and memory objects. The first step 1102 of spatially places the operations and the memory objects onto the tiles. The first step 1102 uses some type of recognition of the tile resources needed for the virtual entities being placed on a particular tile to ensure that there is sufficient tile resources to accommodate all the virtual entities placed on it. One way of accomplishing this is to do a preliminary, minimal resource usage estimate of the physical entities needed to support the virtual entities. This preliminary mapping ensures that a fit exists. Because optimality of the preliminary mapping is not a goal, it can be done simply and quickly. An example is to select a minimal set of ALUs (Arithmetic Logic Units) of different types that collectively are able to perform all the virtual operations mapped to the tile. For some special subsystems, such as a software pipeline loop, there exists a simple procedure for accurately determining the physical entities needed to achieve a certain throughput (performance) for the loop. Such procedures can be leveraged to estimate the physical resource requirement of virtual subsystems.

In an embodiment of the design procedure 700, the spatial planning 702 is typically done with the goal of optimizing the data communication between the tiles. For example, the spatial planning 702 may strive to minimize a distance between source and destination of data transfers along critical computation paths. Opportunity for sharing data transfer segments is another possible consideration during placement decisions.

In an embodiment of the design procedure 700, the routing 704 follows the spatial planning 702. In another embodiment, the routing 704 begins before completion of the spatial planning 702. For example, as a subsystem is placed onto a tile, the virtual wires connecting it to other placed subsystems are routed, before the next subsystem is placed. The routing 704 of the virtual wires places the virtual wires that cross tile boundaries onto the interconnect architecture. The routing 704 also determines the pipelining and the time multiplexing of data communications. Aside from a traditional routing goal of reducing route distances, the routing 704 may also favor routes that have opportunities for sharing data transport segments as long as they do not negatively affect performance. Such sharing opportunities utilize the time multiplexing, or transfers of data which occur in non-overlapping time periods (i.e., a first data transfer begins and ends and then at some later time a second data transfer begins and ends).

Several heuristics are available for finding the sharing opportunities. Opportunities for the multiplexing can be found by identifying data transfers with initiation intervals greater than one. Opportunities for the transfers of data occurring in non-overlapping time periods can be identified by data transfers that cannot be active simultaneously. Sources of such exclusion information include different branches of a conditional and sections of code that are sequential due to control/data-dependence or a compiler imposed sequence.

In an embodiment of the present invention, once the routing 704 determines placements for the virtual wires that cross the tile boundaries, the program intermediate representation is augmented with explicit data communication operations. For data transfers controlled by the programmatic control, explicit copy operations that move data through the data interchanges are inserted. For tag-based switching of data transfers, tag formation and data transfer initiation operations are added.

The scheduling 706 then determines the schedule of the tasks. As preparation for actual scheduling, the latency of each operation on the hardware is extracted. This includes the latency of each data transfer operation (i.e. how many pipeline stages are there between the source and the destination), and the latency of copy operations at the data interchange (including delay through the data segment to the next data interchange). A resource map for each operation may also be prepared to ensure that resources are not over committed. Traditional instruction scheduling technology, such as a modular scheduler for software pipelined loops and list scheduling, can then be applied to generate an overall schedule of operations, including data transfers.

In embodiments of the design procedure 700 where virtual to physical entity mapping is not fixed prior to scheduling 706, the scheduling 706 is done concurrent with selection of hardware entities and mapping of virtual entities to the selected hardware entities. The scheduling 706 may consider a partial schedule that has been put together to influence selection of hardware entities as well as the mapping between virtual and physical entities. This flexibility may result in more efficient systems.

According to an embodiment of the design procedure 700, the design procedure 700 may be embedded within an iterative loop that repeatedly attempts to refine and improve the results obtained in earlier iterations. Thus, information gleaned from earlier iterations may be used to guide choices in a current iteration.

First through third exemplary embodiments of the design procedure 700 illustrate how the scheduling 706 may respond to different placements. Each of the first through third exemplary embodiments implements a calculation, which follows. The calculation is identified with calculation line numbers 1 through 9.

Figure 12:
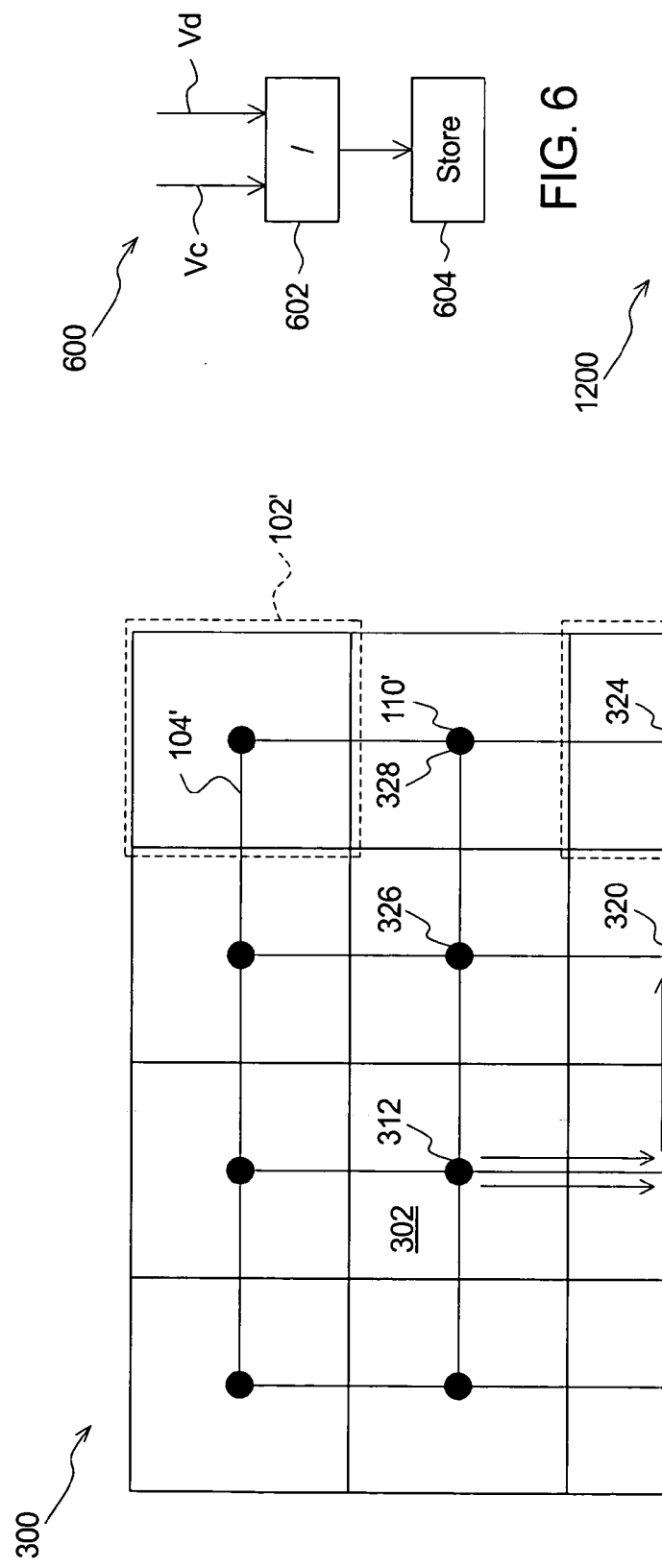
FIG. 12 schematically illustrates a tile configuration according to an embodiment of the present invention.

1. uAddr=a+4;
2. wAddr=b+8;
3. u=load(ObjectU, uAddr);
4. w=load(ObjectW, wAddr);
5. r=a+b;
6. s=5+c;
7. x=u+r;
8. y=w+s;
9. z=s+r;

The first through third exemplary embodiments are discussed relative to a tile configuration illustrated as FIG. 12. Each of the first, second, and third embodiments design a custom circuit device comprising a computational unit, a first memory object, and a second memory object using the steps of the spatial planning 702, the routing 704, and the scheduling 706. The computational unit performs the additions of the calculation, identified above as the calculation line numbers 1, 2, and 5 through 9. The computational unit also holds values of free variables used in the calculation (i.e., the values of a, b, c, etc.) Data object ObjectU and data object ObjectW are placed in the first and second memory objects, respectively.

In the first exemplary embodiment, the spatial planning 702 places the computational unit, the first memory object, and the second memory object tile in first through third tiles, 1202 ... 1206, respectively. The second and third tiles, 1204 and 1206, lie adjacent to the first tile 1202. Thus, the first and second memory objects lie adjacent to the computational unit. In the first exemplary embodiment, the scheduling 706 determines a first schedule as listed in Table 3, which is provided as FIG. 13.

In the second exemplary embodiment, the spatial planning 702 places the computational unit, the first memory object, and the second memory object in the first tile 1202, a fourth tile 1208, and the third tile 1206, respectively. The first and fourth tiles, 1202 and 1208, are separated by the second tile 1204. Thus, in the second exemplary embodiment, the second memory object lies adjacent to the computational unit and the first memory object is separated from the computation unit by an intervening tile. In the second exemplary embodiment, the scheduling 706 determines a second schedule as listed in Table 4, which is provided as FIG. 14. Note that the value u will not be available in tile A until time 7. Hence, the scheduling 706 moves the computation of x=u+r from time 5 to 7, and moves the computation of z=s+r from time 7 to 5.

In the third exemplary embodiment, the spatial planning 702 places the computational unit, the first data memory object, and the second memory object in the first tile 1202, the second tile 1204, and a fifth tile 1210, respectively. The first and fifth tiles are separated by the third tile 1206. Thus, in the third exemplary embodiment, the first memory object lies adjacent to the computational unit and the second memory object is separated from the computational unit by an intervening tile. In the third exemplary embodiment, the scheduling 706 determines a third schedule as listed in Table 5, which is provided as FIG. 15. The computation of wAddr is now done before the computation of uAddr so that it can be sent out earlier to the fifth tile 1210. The computation of z=s+r is again placed in time 5, while the computations of x=u+r and y=w+s are done in time 6 and 7, respectively.

The first through third exemplary embodiments illustrate the benefits of performance of the scheduling 706 after the spatial planning 702, with good clock-cycle granularity timing information derived from the spatial plan. For example, in the first exemplary embodiment, if the schedule had been fixed prior to placement and the placement is subsequently unable to place both the first and second data object tiles adjacent to the computation tile, a resulting system will most likely have to settle for a longer clock cycle period.

Once the scheduling 706 is done, further data path synthesis may be performed to determine the buffering needs. At this point, the design has essentially been converted into a specification that is similar to an RTL specification. Synthesis beyond this point can follow a more classic synthesis flow, including the generation of control state machines, and a more classic place and route for each tile.

The design procedure and reconfigurable device of the present invention provide a number of benefits. The pipelining of data communication within the interconnect architecture allows a short clock cycle time while accommodating long distance communication. The time multiplexing of the data communication enables sharing wires among logically separate communications that, at least partly, traverse the same region of a device. Performing the spatial planning before the pipelining enables accurate determination of the pipeline segments and pipeline depth. Determining the time multiplexing after the spatial planning ensures that accurate information about spatial proximity of communication paths can be used to determine opportunities for sharing of the data transport segments. Performing the scheduling after determination of the pipelining and the time multiplexing enables the scheduling to account for pipeline delays. Determining the data communication by the pipeline segments enables flexible and efficient sharing of the data transport segments. Having a capability of buffering at intermediate points within the interconnect architecture allows flexibility in the routing and the scheduling of multiple data communications through a region of a device.

While the reconfigurable device of the present invention is configured to efficiently take advantage of the design procedure of the present invention, the design procedure has wider applicability beyond the reconfigurable device of the present invention. For example, the design procedure of the present invention can be used to configure a custom circuit device on an existing FPGA. By partitioning the resources of the existing FPGA into virtual tiles and a virtual interconnect architecture, the existing FPGA can be made to emulate the reconfigurable device of the present invention despite the existing FPGA lacking a structure of the reconfigurable device of the present invention.

For example, the design procedure of the present invention can be used to configure what according to today's standard would be a large FPGA. The large FPGA would be divided into the virtual tiles, which according to today's standard would be a moderately sized FPGA. By segmenting the large FPGA into the virtual tiles and configuring it using the design procedure of the present invention, configuration of the large FPGA is simplified and data communication between the virtual tiles can be implemented efficiently.

The reconfigurable device and the design procedure of the present invention also have applicability to ASICs. According to one aspect, the design procedure of the present invention is utilized to design a particular ASIC having a particular application. According to another aspect, the reconfigurable device of the present invention comprises a reconfigurable ASIC.

As described above, the design procedure of the present invention is used to configure a custom circuit device from an existing reconfigurable device. In contrast, the design procedure of the present invention as applied to the particular ASIC designs the particular ASIC. In an embodiment of applying the design procedure to design the particular ASIC, the spatial planning forms tiles on a basis of one or more subsystems forming the tiles. The routing then forms the interconnect architecture include registers and switches for the pipelining and the time multiplexing of data communication between the tiles.

In another embodiment of applying the design procedure to design the particular ASIC, the tiles and the interconnect architecture forms a virtual template. The design procedure comprising the steps of the spatial planning, the routing, and the scheduling configures the tiles and the interconnect architecture of the virtual template. Following this, resources of the tiles and the interconnect architecture that are not used are removed from the virtual template resulting in the design of the particular ASIC.

In contrast to the particular ASIC, the reconfigurable ASIC is designed to address a group of applications. For example, the reconfigurable ASIC can be designed to address a range of applications in the DSP market. The reconfigurable ASIC comprises tiles and an interconnect architecture. In an embodiment of the reconfigurable ASIC, the tiles comprise application specific tiles. In another embodiment of the reconfigurable ASIC, the tiles comprise the application specific tiles and general use tiles.

For the reconfigurable ASIC, the design procedure begins with the design of the hardware of the reconfigurable ASIC and concludes with later configuration of the reconfigurable ASIC for a specific application. In particular, the design of the reconfigurable ASIC at least begins the spatial planning by forming the application specific tiles. When configuring the reconfigurable ASIC for the specific application, the spatial planning is completed by choosing among the application specific tiles and possibly assigning other subsystems to the general use tiles. The configuration of the reconfigurable ASIC also implements the routing and the scheduling steps of the design procedure as described above.

Figure 8:
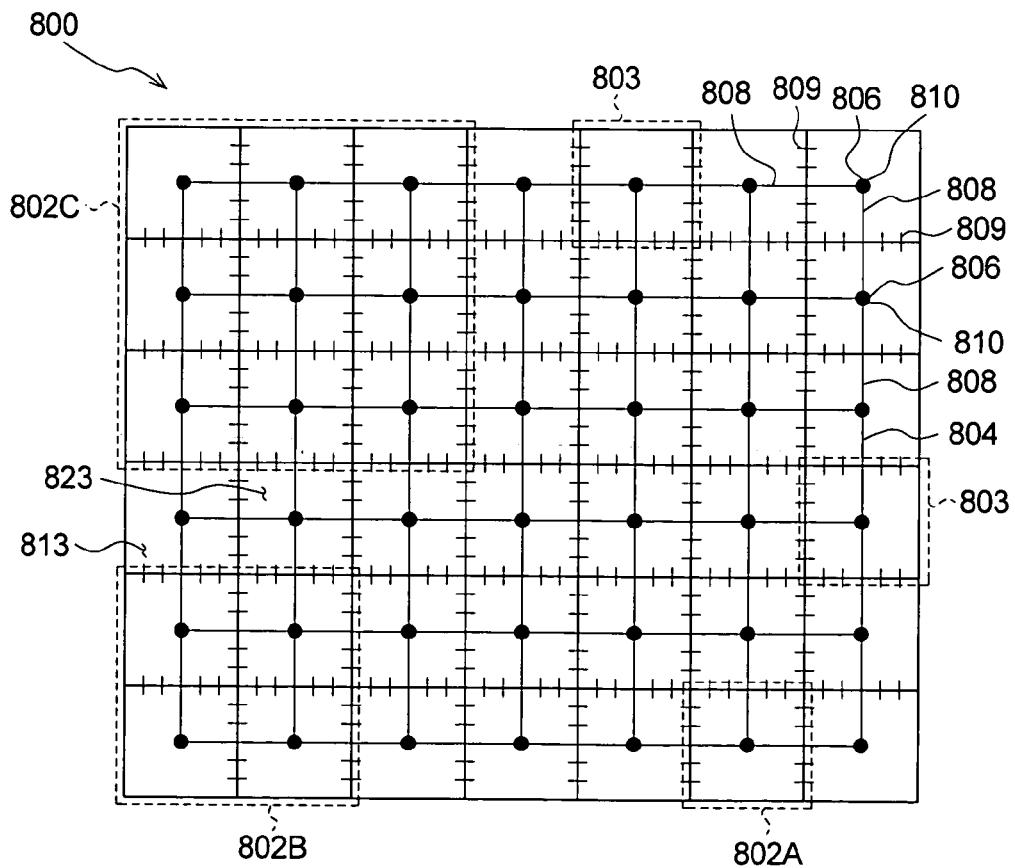
FIG. 8 schematically illustrates a reconfigurable device including mini-tiles according to an embodiment of the present invention.

Another embodiment of a reconfigurable device of the present invention is illustrated schematically in FIG. 8. The reconfigurable device 800 comprises mini-tiles 803 and an interconnect architecture 804. The interconnect architecture 804 couples to interchange points 806 of the mini-tiles 803. Data transport segments 808 of the interconnect architecture 804 couple the mini-tiles 803 to others of the mini-tiles 803. The mini-tiles 803 also couple to adjacent ones of the mini-tiles 803 via local interconnects 809. In an embodiment of the reconfigurable device 800, a data interchange 810 couples each of the mini-tiles 803 to the interconnect architecture 802.

Figure 9:
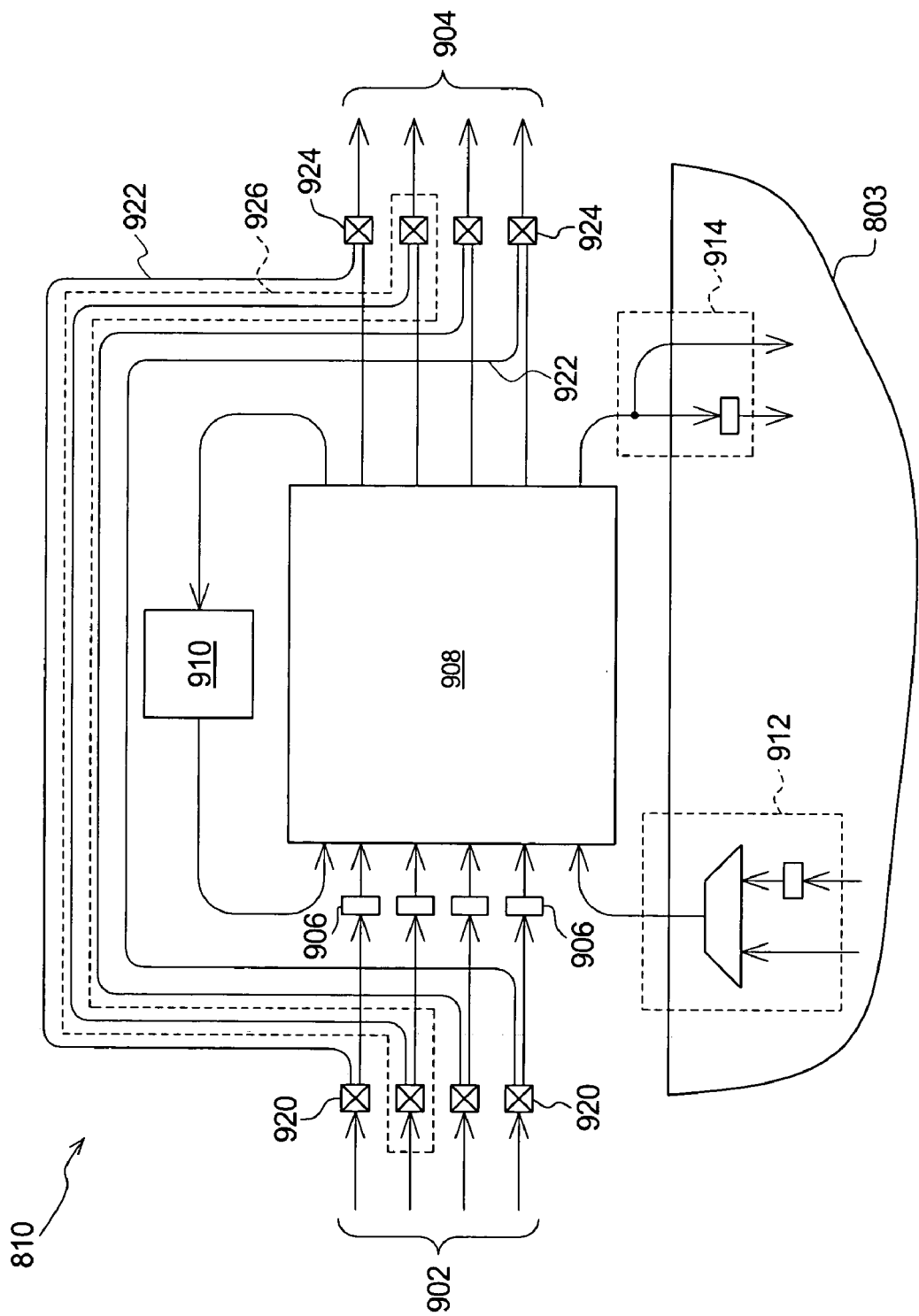
FIG. 9 schematically illustrates a data interchange and a portion of a mini-tile of a reconfigurable device according to an embodiment of the present invention

A portion of one of the mini-tiles 803 and the data interchange 810 are illustrated schematically in FIG. 9. The data interchange 810 comprises incoming data transport segments 902, outgoing data transport segments 904, registers 906, an interchange switch 908, a register file 910, a mini-tile output port 912, a mini-tile input port 914, incoming bypass switches 920, bypasses 922, and outgoing bypass switches 924. The incoming data transport segments 902 are coupled to the outgoing data transport segments 904 via the registers 906 and the interchange switch 908. The incoming data transport segments 902 are also coupled to the outgoing data transport segments 904 via the incoming bypass switches 920, the bypasses 922, and the outgoing bypass switches 924. A bypass circuit 926 of the data interchange 810 comprises a pair of the incoming and outgoing bypass switches, 920 and 924, and one of the bypasses 922.

Clock speed for a particular device need not be fixed and instead can be chosen when configuring the particular device. The reconfigurable device 800 provides flexibility in determination of tiles depending upon chosen clock speed. If the chosen clock speed allows a signal to traverse one of the mini-tiles 803 within about a clock cycle, each of the tiles would comprise one of the mini-tiles 803, which are depicted in FIG. 8 as first tiles 802A. If the clock speed allows a signal to traverse to a 2×2 block of the mini-tiles 803, the tiles would comprise second tiles 802B. Similarly, if the clock speed allows a signal to traverse a 3×3 block of the mini-tiles 803, the tiles would comprise third tiles 803C.

For the second tiles 802B and the third tiles 802C, the tiles can overlap so that one of the mini-tiles 803 can reside within multiple tiles. In such an approach, the tiles comprise overlapping tiles. For example, if the reconfigurable device 800 is configured with the overlapping tiles, a first mini-tile 813 lies within two of the second tiles 802B since the first mini-tile 813 lies along an edge of the reconfigurable device 800. A second mini-tile 823 lies within four of the second tiles 802B since the second mini-tile 823 does not lie along the edge of the reconfigurable device 800. In this situation, a data communication arising in one of the mini-tiles 802 could be transferred to an adjacent one of the mini-tiles 802 through one of the local interconnects 809 since both of the mini-tiles 803 form part of the second tiles 802B.

Alternatively, for the second tiles 802B and the third tiles 802C, the tiles can be configured as non-overlapping tiles. In such an approach, the first and second mini-tiles, 813 and 823, each lie within one of the tiles of the reconfigurable device 800 regardless of whether the tiles of the reconfigurable device 800 comprise the first, second, or third tiles, 802A, 802B, or 802C.

Even if the tiles of the reconfigurable device 800 comprise the first tiles 802A, i.e., each of the tiles comprises one of the mini-tiles 803, it may be more efficient to route a data communication through the local interconnects 809 when a source and a destination lie in adjacent ones of the mini-tiles 803. Such an approach is also useful if the tiles comprise the non-overlapping tiles, which allows the local interconnects 809 to route a data communication between adjacent ones of the non-overlapping tiles.

For the second tiles 802B, the bypass circuits 926 allow signals to be routed around the registers 906 and the switch 908 of every other of the data interchanges 810 while still latching a data transfer within a clock cycle period. For the third tiles 802C, the bypass circuits 926 allow signals to be routed around the registers 906 and the switch 908 of two of the data interchanges 810 while still latching a data transfer within a clock cycle period.

It will be readily apparent to one skilled in the art that the tiles of the reconfigurable device 800 can comprise larger blocks of the mini-tiles 803 than the 3×3 blocks of the third tiles 803C. Further, it will be readily apparent to one skilled in the art that data interchanges 810 need not include the register file 910. Moreover, it will be readily apparent to one skilled in the art that the data interchanges 810 need not include the bypass circuits 926.

According to an embodiment of the reconfigurable device 800, an implementation may choose to clock the interconnect at a faster clock speed so that the absolute time for going through multiple mini-tile data interchanges is similar to the system clock time. For example, for a system using 3×3 blocks of mini-tiles as its tile size, the data interchange may be clocked at three times the frequency of the system clock. This avoids using bypass circuits 926, while maintaining similar absolute time to cross three mini-tiles. It has the further advantage that the interconnect can now sustain a higher throughput.

An alternative data interchange of the present invention can have as few as only two ports, effectively serving as a pipeline stage, and possibly a delay or re-order station. Alternative data transport segments of the present invention may traverse multiple tiles or mini-tiles before entering a data interchange, serving as express lanes that bypass switches for data transport that span longer distances. The alternative data transport segments may still retain pipeline registers at appropriate intervals.

The foregoing detailed description of the present invention is provided for the purposes of illustration and is not intended to be exhaustive or to limit the invention to the embodiments disclosed. Accordingly, the scope of the present invention is defined by the appended claims.

What is claimed is:

1. A method of designing a custom circuit device, which begins with a high level architecture of subsystems coupled by virtual wires, comprising the steps of:
   spatially placing the subsystems onto tiles;
   routing the virtual wires that cross boundaries of the tiles onto an interconnect architecture, the interconnect architecture comprising switches and registers such that some of the switches route a signal from a first subsystem located on a first tile to a second subsystem located on a second tile and further such that at least two of the registers consecutively latch the signal at a time interval of no more than a repeating time period; and
   scheduling of tasks according to clock cycles.

2. The method of claim 1 wherein the repeating time period comprises a clock cycle period.

3. The method of claim 1 wherein the repeating time period comprises a multiple of clock cycle periods.

4. The method of claim 1 further comprising the step of mapping the subsystems and the virtual wires that do not cross the boundaries of the tiles onto circuits of the tiles.

5. The method of claim 1 wherein the subsystems comprise virtual entities.

6. The method of claim 5 wherein the virtual entities comprise operations and memory objects.

7. The method of claim 1 wherein the subsystems comprise hardware entities.

8. The method of claim 7 wherein the hardware entities comprise functional units.

9. The method of claim 7 wherein the hardware entities comprise memory blocks.

10. The method of claim 1 wherein the step of spatially placing the subsystems onto the tiles seeks optimization of communication between the subsystems located on different tiles.

11. The method of claim 10 wherein the optimization of the communication between the subsystems located on different tiles seeks efficient use of communication paths by not sharing of communication path segments by signals.

12. The method of claim 10 wherein the optimization of the communication between the subsystems located on the different tiles seeks to minimize communication distances for critical communication paths.

13. The method of claim 10 wherein the optimization of the communication between the subsystems located on different tiles seeks efficient use of communication paths by sharing of communication path segments by signals.

14. The method of claim 13 wherein the communication comprises time multiplexing of the signals.

15. The method of claim 13 wherein the communication comprises transmission of first and second signals during different time segments.

16. The method of claim 1 wherein the step of scheduling of the tasks comprises accounting for latencies caused by communication between the tiles.

17. The method of claim 1 wherein the step of scheduling of the tasks comprises ensuring that no communication path segment of the interconnect architecture exceeds its capacity.

18. The method of claim 1 wherein the step of scheduling of the tasks comprises generating an overall schedule of operations comprising subsystem tasks and communications between the tiles.

19. The method of claim 1 wherein the step of spatially placing the subsystems onto the tiles begins before the step of routing the virtual wires onto the interconnect architecture.

20. The method of claim 1 wherein the steps of spatially placing the subsystems onto the tiles and routing the virtual wires onto the interconnect architecture overlap in time.

21. The method of claim 1 wherein the steps of spatially placing the subsystems onto the tiles and routing the virtual wires onto the interconnect architecture do not overlap in time.

22. The method of claim 1 wherein the custom circuit device comprises an application specific integrated circuit.

23. The method of claim 1 wherein the custom circuit device comprises a reconfigurable device.

24. The method of claim 23 wherein the reconfigurable device comprises a field programmable gate array.

25. The method of claim 23 wherein the tiles of the reconfigurable device comprise virtual tiles and further wherein the interconnect architecture of the reconfigurable device comprises a virtual interconnect architecture.

26. The method of claim 25 further comprising the steps of allocating resources of the reconfigurable device to the virtual tiles and allocating other resources to the virtual interconnect architecture.

27. The method of claim 23 wherein the tiles of the reconfigurable device comprise real tiles and further wherein the interconnect architecture comprises a real interconnect architecture.

28. The method of claim 27 wherein a physical design of the reconfigurable device comprises the real tiles and the real interconnect architecture.

29. A method of designing a custom circuit device, which begins with a high level architecture of subsystems coupled by virtual wires, comprising the steps of:
   spatially placing the subsystems onto tiles, thereby forming subsystem placements, each of the tiles comprising a circuit;

routing the virtual wires that cross boundaries of the tiles onto an interconnect architecture, the interconnect architecture comprising switches and registers such that some of the switches route a signal from a first subsystem located on a first tile to a second subsystem located on a second tile and further such that at least two of the registers consecutively latch the signal at a time interval of no more than a repeating time period; scheduling of tasks according to clock cycles; and mapping the subsystems and the virtual wires that do not cross the boundaries of the tiles onto the circuits of the tiles according to the subsystem placements.

30. The method of claim 29 wherein the repeating time period comprises a clock cycle period.

31. The method of claim 29 wherein the repeating time period comprises a multiple of clock cycle periods.

32. A method of designing a custom circuit device, which begins with a high level architecture of subsystems coupled by virtual wires, comprising the steps of:

spatially placing the subsystems onto tiles;

routing the virtual wires that cross boundaries of the tiles onto an interconnect architecture, the interconnect architecture comprising switches and registers such that some of the switches route a signal from a first subsystem located on a first tile to a second subsystem located on a second tile and further such that at least two of the registers consecutively latch the signal at a time interval of no more than a clock cycle period; and scheduling of tasks according to clock cycles.

33. A computer readable memory comprising computer code for implementing a method of designing a custom circuit device, which begins with a high level architecture of subsystems coupled by virtual wires, the method of designing the custom circuit device comprising the steps of:

spatially placing the subsystems onto tiles;

routing the virtual wires that cross boundaries of the tiles onto an interconnect architecture, the interconnect architecture comprising switches and registers such that some of the switches route a signal from a first subsystem located on a first tile to a second subsystem located on a second tile and further such that at least two of the registers consecutively latch the signal at a time interval of no more than a repeating time period; and scheduling of tasks according to clock cycles.

34. A computer readable memory comprising computer code for implementing a method of designing a custom circuit device, which begins with a high level architecture of subsystems coupled by virtual wires, the method of designing the custom circuit device comprising the steps of:

spatially placing the subsystems onto tiles, thereby forming subsystem placements, each of the tiles comprising a circuit;

routing the virtual wires that cross boundaries of the tiles onto an interconnect architecture, the interconnect architecture comprising switches and registers such that some of the switches route a signal from a first subsystem located on a first tile to a second subsystem located on a second tile and further such that at least two of the registers consecutively latch the signal at a time interval of no more than a repeating time period;

scheduling of tasks according to clock cycles; and mapping the subsystems and the virtual wires that do not cross the boundaries of the tiles onto the circuits of the tiles according to the subsystem placements.

35. A computer readable memory comprising computer code for implementing a method of designing a custom circuit device, which begins with a high level architecture of subsystems coupled by virtual wires, the method of designing the custom circuit device comprising the steps of:

spatially placing the subsystems onto tiles;

routing the virtual wires that cross boundaries of the tiles onto an interconnect architecture, the interconnect architecture comprising switches and registers such that some of the switches route a signal from a first subsystem located on a first tile to a second subsystem located on a second tile and further such that at least two of the registers consecutively latch the signal at a time interval of no more than a clock cycle period; and scheduling of tasks according to clock cycles.

* * * * *